(12) United States Patent
Seo et al.

(10) Patent No.: US 11,894,476 B2
(45) Date of Patent: Feb. 6, 2024

(54) COLORLESS TRANSPARENT SEMICONDUCTOR SUBSTRATE AND METHOD FOR MANUFACTURING SAME

(71) Applicant: UNIST(ULSAN NATIONAL INSTITUTE OF SCIENCE AND TECHNOLOGY), Ulsan (KR)

(72) Inventors: Kwan Yong Seo, Ulsan (KR); Kang Min Lee, Ulsan (KR)

(73) Assignee: UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 0 days.

(21) Appl. No.: 17/267,031

(22) PCT Filed: Jun. 14, 2019

(86) PCT No.: PCT/KR2019/007221
§ 371 (c)(1),
(2) Date: Feb. 9, 2021

(87) PCT Pub. No.: WO2020/111422
PCT Pub. Date: Jun. 4, 2020

(65) Prior Publication Data
US 2021/0305444 A1  Sep. 30, 2021

(30) Foreign Application Priority Data

Nov. 29, 2018 (KR) .................. 10-2018-0150847
Apr. 29, 2019 (KR) .................. 10-2019-0049829

(51) Int. Cl.
*H01L 31/0352* (2006.01)
*H01L 31/0445* (2014.01)
(Continued)

(52) U.S. Cl.
CPC .... *H01L 31/035281* (2013.01); *H01L 31/028* (2013.01); *H01L 31/02167* (2013.01);
(Continued)

(58) Field of Classification Search
CPC ......... H01L 31/0468; H01L 31/035281; H01L 31/1868; H01L 31/02167; H01L 31/02168
See application file for complete search history.

(56) References Cited

U.S. PATENT DOCUMENTS 5,254,179 A * 10/1993 Ricaud ............ H01L 31/022425
136/244
7,795,067 B1 * 9/2010 Basol .................. H01L 31/0749
438/57
(Continued)

FOREIGN PATENT DOCUMENTS

KR 10-2002-0000813 A 1/2002
KR 10-2009-0031232 A 3/2009
(Continued)

OTHER PUBLICATIONS

Lockau, et al., Solar Energy Materials and Solar Cells, 2014, vol. 125, pp. 298-304 (Year: 2014).*
(Continued)

*Primary Examiner* — Sadie White
(74) *Attorney, Agent, or Firm* — Revolution IP, PLLC

(57) ABSTRACT

There is provided a transparent semiconductor substrate and a method for manufacturing same includes a semiconductor substrate including a first surface and a second surface opposite to the first surface; and a through-hole penetrating the semiconductor substrate, wherein the through-hole includes an inclined portion inclined with respect to the first surface and second surface.

10 Claims, 7 Drawing Sheets

(51) Int. Cl.
*H01L 31/054* (2014.01)
*H01L 31/0216* (2014.01)
*H01L 31/028* (2006.01)
*H01L 31/0304* (2006.01)
*H01L 31/0376* (2006.01)
*H01L 31/18* (2006.01)
*H01L 31/20* (2006.01)

(52) U.S. Cl.
CPC .... *H01L 31/02168* (2013.01); *H01L 31/0304* (2013.01); *H01L 31/03046* (2013.01); *H01L 31/03762* (2013.01); *H01L 31/0445* (2014.12); *H01L 31/0547* (2014.12); *H01L 31/1804* (2013.01); *H01L 31/184* (2013.01); *H01L 31/1808* (2013.01); *H01L 31/1844* (2013.01); *H01L 31/1868* (2013.01); *H01L 31/202* (2013.01)

(56) References Cited

U.S. PATENT DOCUMENTS

| | | |
|---|---|---|
| 2002/0157956 A1 | 10/2002 | Ikeda |
| 2005/0099577 A1 | 5/2005 | Lee et al. |
| 2006/0112987 A1* | 6/2006 | Nakata .............. H01L 31/03921 136/256 |
| 2007/0131272 A1* | 6/2007 | Lim ................... H01L 31/0468 136/244 |
| 2007/0189688 A1* | 8/2007 | Dehlinger ......... H01L 31/02327 385/40 |
| 2008/0072959 A1* | 3/2008 | Chen ............... H01L 31/022483 257/E31.13 |
| 2009/0007955 A1* | 1/2009 | Nakashima ..... H01L 31/022475 438/73 |
| 2009/0079322 A1 | 3/2009 | Tsutsumi et al. |
| 2009/0151784 A1 | 6/2009 | Luan et al. |
| 2009/0257063 A1* | 10/2009 | Smith ................... G01J 3/4535 359/223.1 |
| 2010/0193022 A1* | 8/2010 | Hong .............. H01L 31/035281 257/E31.127 |
| 2010/0194091 A1 | 8/2010 | Heim et al. |
| 2010/0294348 A1* | 11/2010 | Li ......................... H01L 31/046 136/252 |
| 2010/0300518 A1* | 12/2010 | Moslehi .................. H01L 21/00 136/255 |
| 2012/0048342 A1* | 3/2012 | Lim ..................... H01L 31/0465 136/249 |
| 2012/0122271 A1* | 5/2012 | Cheng ................. H01L 31/0468 438/98 |
| 2013/0220396 A1* | 8/2013 | Janssen ........... H01L 31/022425 438/98 |
| 2015/0171229 A1* | 6/2015 | Gho ................ H01L 31/022441 136/256 |
| 2016/0126407 A1* | 5/2016 | Cardi .............. H01L 31/022425 438/57 |
| 2017/0326688 A1* | 11/2017 | Turner .................. B23K 26/382 |
| 2018/0108795 A1* | 4/2018 | Jeong ................ H01L 31/03923 |

FOREIGN PATENT DOCUMENTS

| | | |
|---|---|---|
| KR | 10-2010-0097150 A | 9/2010 |
| WO | 2018/157495 A1 | 9/2018 |

OTHER PUBLICATIONS

Du, et al., Optics Letters, 2011, vol. 36, No. 9, pp. 1713-1715 (Year: 2011).*
Willeke, et al., Appl. Phys. Lett. 64 (10), Mar. 7, 1994 (Year: 1994).*
International Search Report for PCT/KR2019/007221 dated Sep. 27, 2019 from Korean Intellectual Property Office.

* cited by examiner

COLORLESS TRANSPARENT SEMICONDUCTOR SUBSTRATE AND METHOD FOR MANUFACTURING SAME

TECHNICAL FIELD

The present invention is made with funding from the Ministry of Trade, Industry and Energy under the title of "Development of multi-colored semi-Transparent crystalline silicon solar cells" of the project identification number 20183010013900.

The present invention relates to a transparent semiconductor substrate and a method for manufacturing same.

BACKGROUND

In accordance with the development of the semiconductor industry and the demand for high integration and high performance of electronic devices, semiconductor substrates including various semiconductor materials (for example, crystalline silicon, germanium, gallium arsenide (GaAs), gallium arsenide Phosphide (GaAsP)) are used. However, the semiconductor substrate (for example, wafer) made of such semiconductor materials is essentially opaque because it does not transmit visible light. As a result, there is a limitation in manufacturing a transparent electronic device due to the opacity of the substrate.

For example, the crystalline silicon has been used as a material for solar cells and various electronic devices due to the abundance of raw materials and high stability. In recent years, there is a growing interest in the development of next-generation devices such as transparent electronic devices (for example, transparent semiconductors and transparent displays) increases. However, in the related art, crystalline silicon-based semiconductor devices have limitations in configuring a transparent electronic device due to the opacity of crystalline silicon.

To solve this problem, thin-film solar cells using substrates using amorphous silicon, CdTe, or the like, and dye-sensitized solar cells using substrates based on organic materials, or the like have been suggested as research results of transparent solar cells, but still some visible light is absorbed such that there is still a limit to the color of the substrate.

Therefore, in order to develop a colorless and transparent electronic device, development of a colorless transparent semiconductor substrate is required.

SUMMARY OF INVENTION

Technical Problem

An embodiment of the present invention provides a colorless transparent semiconductor substrate having colorless transparency and an improved viewing angle by penetrating all light in a visible light region.

Solution to Problem

According to an embodiment, there is provided a transparent semiconductor substrate including a semiconductor substrate including a first surface and a second surface opposite to the first surface; and a through-hole penetrating the semiconductor substrate, in which the through-hole includes an inclined portion inclined with respect to the first surface and second surface.

According to an embodiment, a diameter of the through-hole increases from the first surface to the second surface.

According to an embodiment, a cross section of the through-hole in a longitudinal direction is a trapezoidal shape.

According to an embodiment, the inclined portion is configured to form an acute angle with respect to the first surface.

According to an embodiment, the diameter of the through-hole is equal to or more than 1 μm on the first surface.

According to an embodiment, a diameter of the through-hole on the first surface is defined so that a haze value calculated by Equation 1 below is less than 1%:

$$H (\%) = T_d/T_t \times 100 \qquad \text{<Equation 1>}$$

Where $T_d$ is diffuse transmittance and $T_t$ is total transmittance.

According to an embodiment, wherein a distance $S_1$ between the through-holes on the first surface is calculated by Equation 2 below:

$$S_1 < 2\pi L \times 1/360 \times 1/60 \qquad \text{<Equation 2>}$$

Where L is a distance between the substrate and an observer.

According to an embodiment, the transparent semiconductor substrate further includes a light-reflecting layer.

According to an embodiment, the transparent semiconductor substrate further includes light-reflecting layer disposed on the first surface, the inclined portion, and the second surface.

According to an embodiment, the transparent semiconductor substrate further includes an anti-reflection layer.

According to an embodiment, the transparent semiconductor substrate further includes an anti-reflection layer disposed on the first surface, the inclined portion, and the second surface.

According to an embodiment, the semiconductor substrate includes crystalline silicon (c-Si), germanium (Ge), gallium arsenide (GaAs), gallium arsenide Phosphide (GaAsP), amorphous silicon (a-Si), or a combination thereof.

According to an embodiment, the transparent semiconductor substrate further includes a passivation layer disposed on the first surface, the second surface, and the inclined portion.

According to an embodiment, the transparent semiconductor substrate further includes a passivation layer disposed to directly contact the first surface, the second surface, and the inclined portion of the semiconductor substrate.

According to an embodiment, the passivation layer includes oxides, carbides, or nitrides of at least one element selected from metals, transition metals, and metalloids.

According to an embodiment, there is provided a method for manufacturing a transparent semiconductor substrate including preparing a semiconductor substrate including a first surface and a second surface opposite to the first surface; and forming a plurality of through-holes on the semiconductor substrate, in which the through-hole includes an inclined portion inclined with respect to the first surface and the second surface.

According to an embodiment, a total area of the through-hole on the first surface is 5% to 95% of the total area of the semiconductor substrate, the total area of the through-hole on the second surface is 6% to 96% of the total area of the semiconductor substrate, and the total area of the through-hole on the first surface is smaller than that of the through-hole on the second surface.

According to an embodiment, the inclined portion is configured to form an acute angle with respect to the first surface.

According to an embodiment, the method for manufacturing a transparent semiconductor substrate including further includes forming a passivation layer after forming the through-hole.

According to an embodiment, the method for manufacturing a transparent semiconductor substrate including further includes forming an anti-reflection layer or a light-reflecting layer after forming the passivation layer.

Advantageous Effects

Since a transparent semiconductor substrate according to an embodiment has a wide viewing angle by including a semiconductor substrate including a first surface and a second surface opposite to the first surface; and a through-hole penetrating the semiconductor substrate, in which the through-hole includes an inclined portion inclined with respect to the first surface and second surface, it is possible to maintain constant transparency even at various viewing angles.

BEST MODE FOR INVENTION

Figure 1:
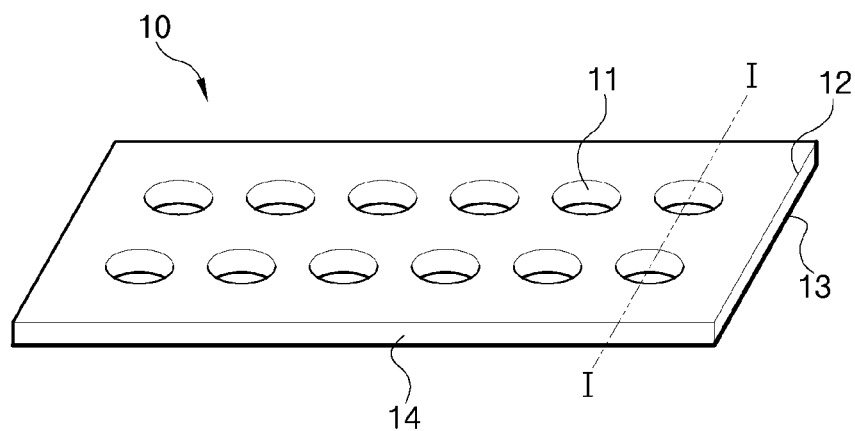
FIG. 1 is a perspective view of a colorless transparent semiconductor substrate according to an embodiment of the present invention.

The present inventive concept described below may apply various transformations and may have various embodiments. Specific embodiments are illustrated in the drawings and will be described in detail in the detailed description. However, this is not intended to limit the present creative idea to a specific embodiment, it should be understood to include all transformations, equivalents, or substitutes included in the technical scope of the present creative idea.

The terms used below are only used to describe specific embodiments and are not intended to limit the present inventive idea. Singular expressions include plural expressions unless the context clearly indicates otherwise. Hereinafter, terms such as "comprises" or "have" are intended to indicate the presence of features, numbers, steps, actions, components, parts, components, materials, or a combination thereof described in the specification. It is to be understood that it does not preclude the possibility of the presence or addition of one or more other features, numbers, steps, actions, components, parts, components, materials, or combinations thereof. "/" used below may be interpreted as "and" or "or" depending on the situation.

In the drawings, the diameter, length, and thickness are enlarged or reduced in order to clearly express various components, layers, and regions. The same reference numerals are assigned to similar parts throughout the specification. Throughout the specification, when a part such as a layer, film, region, or plate is said to be "on" or "above" another part, this includes not only the case directly above the other part, but also the case where there is another part in the middle. Throughout the specification, terms such as first and second may be used to describe various constituent elements, but constituent elements should not be limited by terms. The terms are used only for the purpose of distinguishing one component from another. In the drawings, some of the components may be omitted, but this is to aid understanding of the features of the invention and is not intended to exclude the omitted components.

Throughout the specification, when a portion such as a layer, a film, a region, or a plate is said to be in "direct contact" with another portion, it means that one portion is in physical contact without another intermediate layer between the other portions.

"Colorless" means no color. For example, in the CIE 1931 chromaticity diagram, a (x, y) coordinate may be a color corresponding to (0.2905, 0.2999), (0.3028, 0.3163), (0.3127, 0.3290), (0.3134, 0.3313), or (0.3324, 0.3474).

Figure 2:
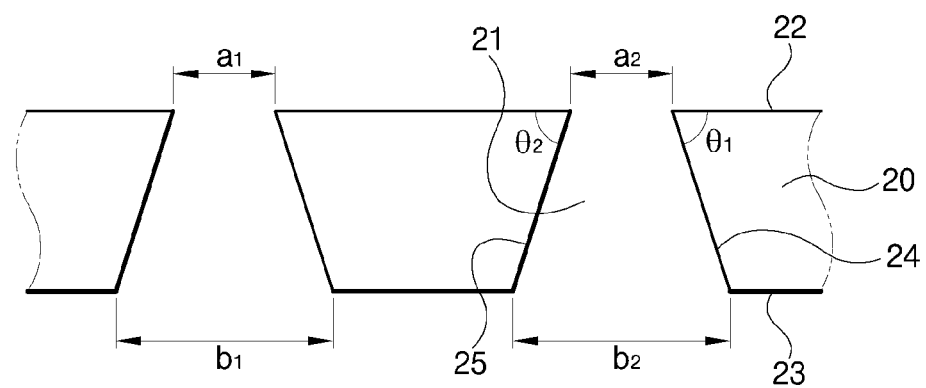
FIG. 2 is a cross-sectional view of the colorless transparent semiconductor substrate taken along line I-I' FIG. 1.

FIG. 1 is a plan view illustrating a colorless transparent semiconductor substrate according to an embodiment of the present invention, and FIG. 2 is a cross-sectional view schematically illustrating a cross section taken along line I-I' of FIG. 1.

First, referring to FIG. 1, a colorless transparent semiconductor substrate 10 according to an embodiment of the present invention includes a first surface 12 and a second surface 13, has a thickness between the first surface and the second surface, and the silicon substrate 10 includes a plurality of through-holes 11 penetrating the first surface 12, the second surface 13, and the thickness between the first surface and the second surface.

The through-holes 11 may form an arbitrary pattern but are not limited thereto. For example, the through-holes 11 may be formed on the substrate while maintaining the same distance from each other.

The total area of the through-holes on the first surface 12 may be 5% to 95% of the total area of the semiconductor substrate, and the total area of the through-holes on the second surface 13 may be 6% to 96% of the total area of the semiconductor substrate. The total area of the through-holes on the first surface is smaller than that of the through-holes on the second surface.

For the through-hole 11, looking more specifically with reference to FIG. 2, the through-hole 11 has a side wall extending from the first surface 22 to the second surface 23 by penetrating the thickness of the substrate, and the side wall may include a first inclined portion 24 and a second inclined portion 25.

The first inclined portion 24 and the second inclined portion 25 may be configured to extend in a direction in which a distance from each other increases, but the present invention is not limited thereto, and may be configured to extend in a direction parallel to each other.

The first inclined portion 24 may be configured to form an acute angle $\theta_1$ with respect to the first surface 22, and the second inclined portion 25 is an acute angle $\theta_2$ with respect to the first surface 22. At this time, the acute angle $\theta_1$ and the acute angle $\theta_2$ may be the same or different from each other. Although it will be described below in more detail, a viewing angle may be improved depending on the size of the acute angle $\theta_1$ and the acute angle $\theta_2$.

A cross section of the through-hole 21 may have a pyramid shape, but is not limited thereto, and may also have a parallelogram shape depending on the size of the acute angle $\theta_1$ and the acute angle $\theta_2$. In addition, a plurality of through-holes may have the same or different cross-sectional shapes. When the plurality of through-holes have the same cross-sectional shape, a certain viewing angle can be secured. When the plurality of through-holes have different cross-sectional shapes, since they may have different viewing angles depending on the viewing angle, it is easy to adjust transparency according to the viewing angle.

The through-hole 21 has a diameter $a_1$ and a diameter $b_1$ different from each other on the first surface and the second surface. For example, the diameter $a_1$ may be smaller than the diameter $b_1$. In addition, the semiconductor substrate may include the plurality of through-holes 21, the diameter $a_1$ and the diameter $a_2$ of the through-hole may be different from each other, and the diameter $b_1$ and the diameter $b_2$ may be different from each other, but from the viewpoint of securing an equivalent level of viewing angle according to the viewing angle, it is preferable that the diameter $a_1$ and the diameter $a_2$ are the same and the diameter $b_1$ and the diameter $b_2$ are the same.

The through-hole 21 may be manufactured by a method of etching the semiconductor substrate or a method of depositing and growing a semiconductor (for example, method of growing polysilicon).

A method of etching the semiconductor substrate may include a dry etching method or a wet etching method.

According to an embodiment, the through-holes 11 patterns a portion to be etched on the first surface 12 of the semiconductor substrate 10 by using a photolithography process. Thereafter, a metal mask layer is formed on the remaining first surface 12 that is not patterned through a metal mask deposition process, and a photoresist is removed. Thereafter, the plurality of through-holes 11 are formed on the semiconductor substrate 10 by bringing $SF_6$ and $C_4F_8$ gases into contact with the substrate. At this time, by adjusting the flow rates of the $SF_6$ and $C_4F_8$ gases, the inclination of an inner surface of the through-hole is adjusted.

According to another embodiment, the through-holes 11 pattern a portion not to be etched on the first surface 12 of the semiconductor substrate 10 by using the photolithography process. Thereafter, the plurality of through-holes are manufactured by immersing the semiconductor substrate in a basic etching solution or an acid etching solution.

At this time, in a case of manufacturing the through-hole using the basic etching solution, after the photolithography process, the substrate is immersed in the basic etching solution (for example, KOH), thereby forming the plurality of through-holes. In a case of manufacturing the through-hole using the acid etching solution (for example, hydrofluoric acid/hydrogen peroxide or nitric acid/fluoric acid mixed solution), after the photolithography process, a metal catalyst layer is selectively formed on a portion of the first surface 12 to be etched, and then the substrate is immersed in the acidic etching solution, thereby forming the plurality of through-holes.

At this time, the inclination of the inner surface of the through-hole is adjusted according to a crystal structure of the semiconductor substrate and the concentration of the etching solution. In addition, the diameter of the through-hole is controlled by adjusting an immersion time of the substrate in the etching solution.

Figure 8:
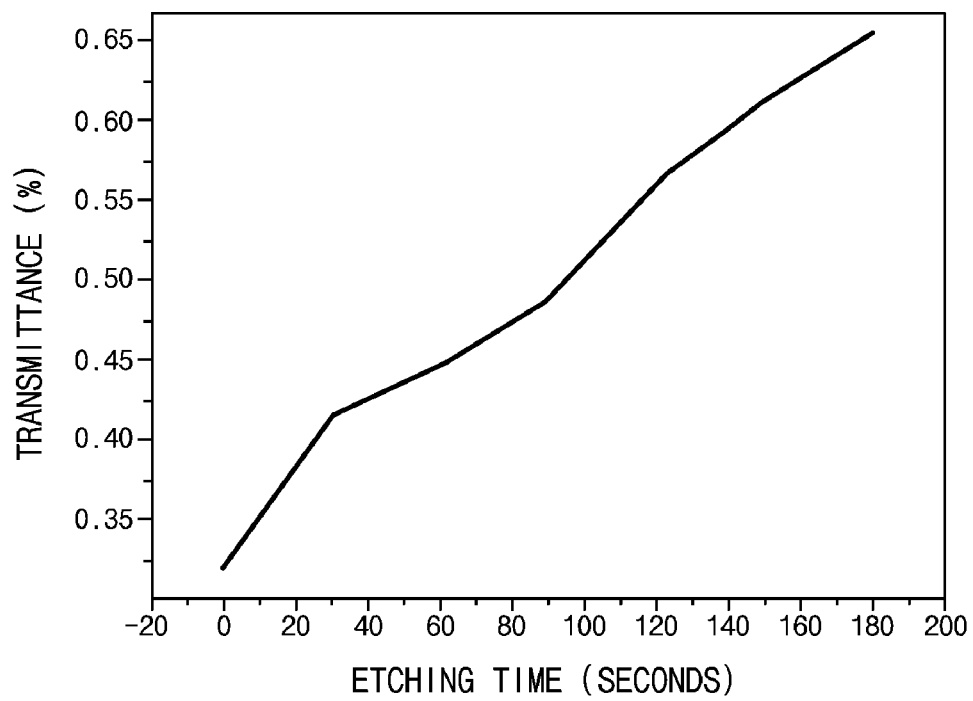
FIG. 8 is a graph illustrating change in transmittance according to an etching time of the semiconductor substrate according to an embodiment.

For example, after immersing the semiconductor substrate including the through-hole having the diameter of 103 μm on the first surface in the acidic etching solution (for example, RSE-100), the diameter of the through-hole on the first surface increases by approximately 10% to 113 μm after 30 seconds. As the diameter of the through-hole increases, a distance between the through-holes is relatively reduced, and as a result, transmittance may be improved. In order to support this result, a change in the diameter of the through-hole and a change in the transmittance according to an etching time are measured, and a result is illustrated as a graph in FIG. 8. Referring FIG. 8, it can be seen that as the etching time increases, the diameter of the through-hole increases, and as a result, the transmittance increases.

In the semiconductor deposition and growth method, for example, after a spacing between the $SiO_2$ beads is adjusted by arranging $SiO_2$ beads on the substrate and adjusting a size of the $SiO_2$ bead by reactive ion etch (RIE), semiconductors are deposited between the $SiO_2$ beads by depositing a semiconductor material on the substrate, and the $SiO_2$ beads and the substrate are removed such that the semiconductor substrate having the through-holes may be manufactured.

Figure 3:
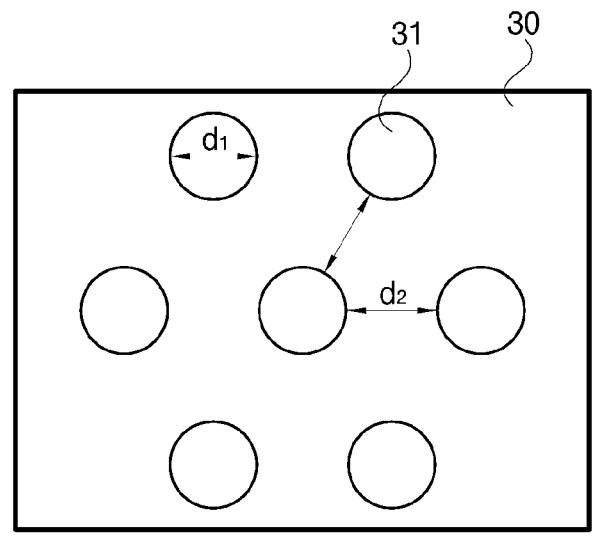
FIG. 3 is a perspective view illustrating arrangement of through-holes on a surface of the colorless transparent semiconductor substrate.

FIG. 3 is a top view of the first surface of the semiconductor substrate viewed in a vertical direction with respect to the first surface. Referring to FIG. 3, the semiconductor substrate 30 includes the plurality of through-holes 31, the through-holes 31 are arranged to be spaced apart from each other at a predetermined interval $d_2$. The through-holes 31 may be circular holes as illustrated in FIG. 3, but is not limited thereto, and may be polygonal holes (not illustrated). Each of the plurality of through-holes 31 may be formed with a size of equal to or greater than 1 μm or equal to or less than 20 cm so that the through-hole may pass at least all light in the visible light region and be manufactured by the photolithography process. Here, the diameter $d_1$ of the through-hole 31 means the largest value among the diameter of a circle or a line segment connecting two vertices in a case of a polygon. By configuring the diameter of the through-hole 31 to have equal to or greater than 1 μm, all visible light can pass.

According to another embodiment, the diameter $d_1$ of the through-hole 31 may be equal to or greater than 100 μm, and when the diameter $d_1$ of the through-hole 31 is equal to or greater than 100 μm, since the visible light can pass through the substrate without light scattering and light diffusion, the transparency of the substrate 30 is improved. When the diameter $d_1$ of the through-hole 31 is 100 μm, a haze value calculated by Equation 1 below is 0.95%, which is very close to the known haze value of 0.85%. Therefore, it can be seen that the transparent substrate such as a glass is obtained when the diameter $d_1$ of the through-hole 31 is equal to or greater than 100 μm.

$$H\ (\%) = T_d/T_t \times 100 \qquad \text{<Equation 1>}$$

Here, $T_d$ is diffuse transmittance, and $T_t$ is the total transmittance.

In addition, although not illustrated, since the diameter of the through-hole on the second surface is greater than the diameter of the through-hole on the first surface, light can pass through the through-hole without scattering the visible light. As a result, the semiconductor substrate may have a colorless and transparent property because a specific color is not expressed.

Figure 4:
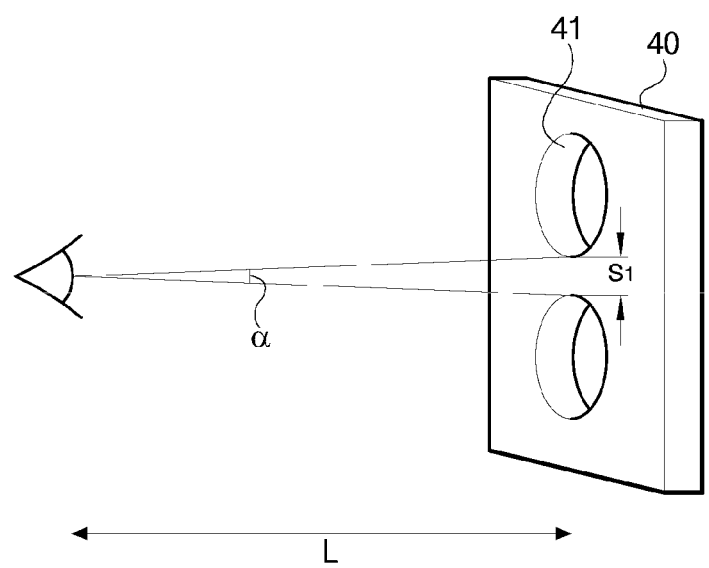
FIG. 4 is a diagram illustrating correlation between a distance between the through-holes and a distance between an observer and the substrate on the surface of the colorless transparent semiconductor substrate.

Referring to FIG. 4, in order for the semiconductor substrate 40 to be visually recognized as colorless and transparent, through-holes 41 disposed in the semiconductor substrate should not be visually recognized. Specifically, when the distance of the through-holes is adjusted such that a distance $S_1$ between the through-holes 41 satisfies Equation 2, the through-holes are not visually recognized.

$$S_1 < 2\pi L \times 1/360 \times 1/60 \qquad \text{<Equation 2>}$$

Here, L is a distance between an observer and the substrate, and $S_1$ is the distance between the through-holes.

Depending on the intended use of the semiconductor substrate, by controlling the distance between the through-holes in consideration of the distance between the observer and the substrate, it is possible to obtain the colorless transparent semiconductor substrate regardless of a thickness of the semiconductor substrate.

For example, the distance $S_1$ between the through-holes may be formed to be equal to or less than 200 μm but is not limited thereto.

FIG. 5 and FIG. 6 are diagrams illustrating the difference of viewing angles in a semiconductor substrate 50 having a cylindrical through-hole in the related art and a semiconductor substrate 60 having the through-hole according to an embodiment of the present invention.

Figure 5A:
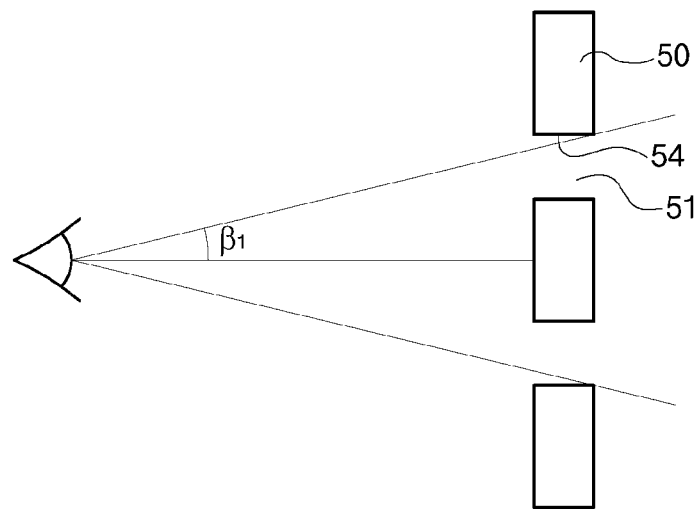
FIG. 5a and FIG. 5b are diagrams illustrating a viewing angle of a substrate having cylindrical through-holes.

Referring to FIG. 5(a), since a thickness portion of through-holes 51 of the semiconductor substrate 50 having the cylindrical through-hole in the related art is perpendicular to the first and second surfaces, the viewing angle is limited. That is, as illustrated in FIG. 5(a), a viewing angle $\beta_1$ in the semiconductor substrate 50 having the cylindrical through-hole in the related art is limited. In addition, in order to widen the viewing angle, since it is important not to recognize the thickness portion of the through-hole 51 in view, the thickness of the semiconductor substrate 50 has to be reduced.

Figure 6A:
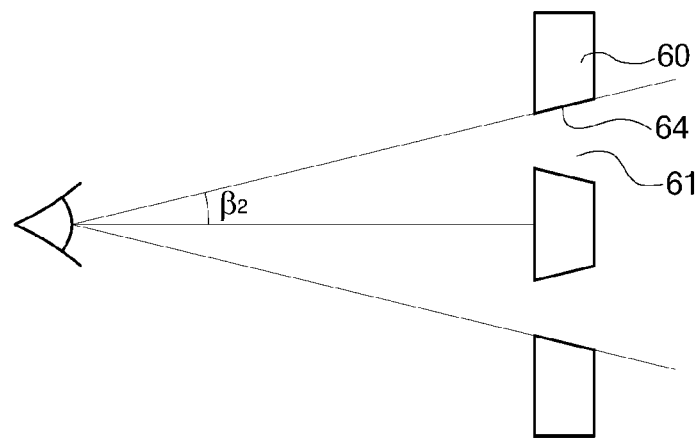
FIG. 6a and FIG. 6b are diagrams illustrating the viewing angle of a substrate having through-holes with an inclined portion on an inner side.

In contrast, referring to FIG. 6(a), in the semiconductor substrate 60 according to an embodiment of the present invention, since the thickness portion of the through-hole 61 has an inclination, a viewing angle $\beta_2$ is larger than the viewing angle $\beta_1$ in FIG. 5(a). As a result, there is no need to adjust the thickness of the semiconductor substrate in order to increase the viewing angle, and it is possible to secure a sufficient viewing angle by adjusting the inclination of the thickness portion.

Figure 5B:
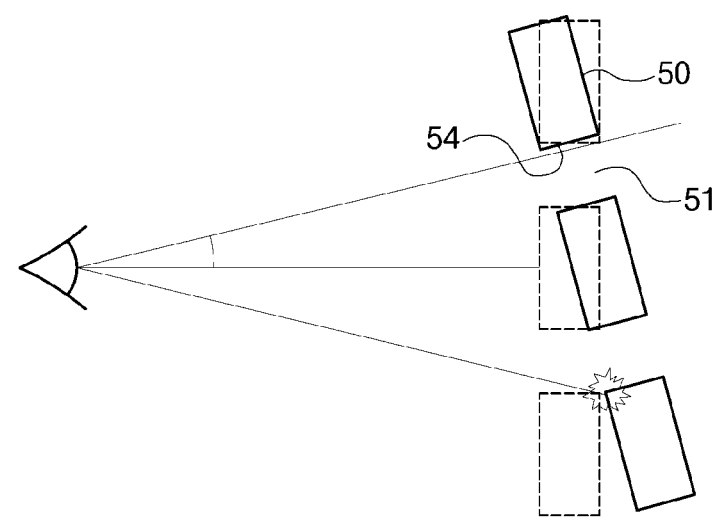
Figure 6B:
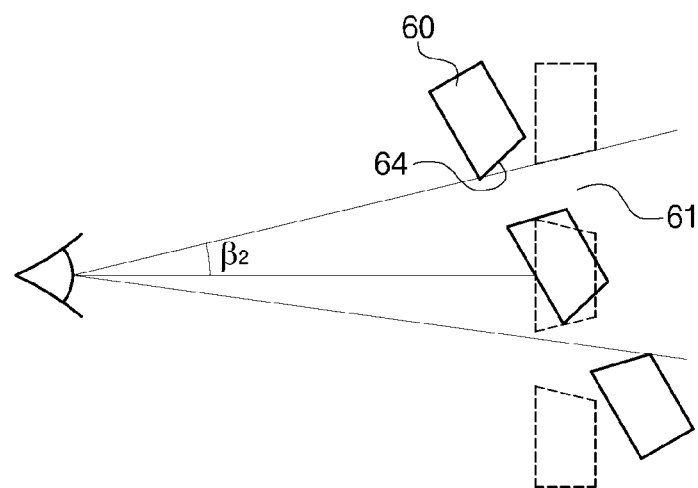

In addition, as illustrated in FIG. 5(b) and FIG. 6(b), when the semiconductor substrate is tilted at an angle, in a case of a substrate having a cylindrical through-hole, a change in transparency can be detected by recognizing an inner wall (that is, thickness portion) of the through-hole. However, in a case of a substrate including the through-hole having the inclined portion, even when the substrate is inclined to an angle equal to or less than the inclined angle, since the view does not reach the inner wall of the through-hole, it is possible to maintain uniform transparency.

Figure 7:
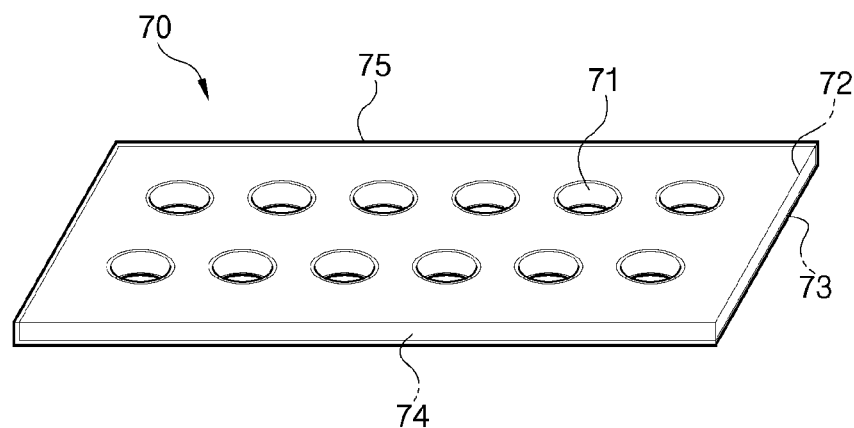
FIG. 7 is a perspective view of a colorless transparent semiconductor substrate according to another embodiment.

FIG. 7 is a perspective view of a colorless transparent semiconductor substrate according to another embodiment.

Referring to FIG. 7, a colorless transparent semiconductor substrate 70 according to another embodiment includes a first surface 72 and a second surface 73, and includes a thickness 74 between the first surface and the second surface, and the silicon substrate 70 includes a plurality of through-holes 71 penetrating the first surface 72, the second surface 73, and a thickness between the first surface and the second surface, and further includes a coating layer 75 covering an inner surface of the plurality of through-holes 71 penetrating the first surface, the second surface, and the thickness 74 between the first surface and the second surface. The coating layer includes an anti-reflection layer or a light-reflecting layer.

The anti-reflection layer may reduce reflectance of light reflected by a surface of the silicon substrate among incident light.

For example, the anti-reflection layer may have a structure of a silicon nitride film, a silicon nitride film containing hydrogen, a silicon oxide film, a silicon oxynitride film, a single film selected from a group consisting of $MgF_2$, ZnS, $TiO_2$, and $CeO_2$, or a multilayer structure in which two or more films are combined. The coating layer 75, for example, the anti-reflection layer not only reduces light reflection from the first surface and the second surface, but also reduces reflection of light passing through the through-hole 71 by being formed to cover the first surface 72, the inner surface of the plurality of through-holes 71, and the second surface 73.

The anti-reflection layer may include a surface structure of various irregularities such as pyramids, squares, and triangles. The surface structure may be formed by a method of increasing the surface roughness of the anti-reflection layer by various methods such as the dry etching and the wet etching. The transparency of a silicon crystalline substrate is improved by the introduction of such an anti-reflection layer.

The light-reflecting layer may increase the reflectance of light incident on the semiconductor substrate.

The light-reflecting layer may include a metal coating or a metal flake having high surface reflectivity. For example, the metal includes all metals capable of reflecting light such as Al, Ag, and Au. Alternatively, the light-reflecting layer may be formed by polishing the surface of the semiconductor substrate.

The anti-reflection layer and the light-reflecting layer are formed by a method such as sputtering, e-beam evaporation, chemical vapor deposition (CVD), physical vapor deposition (PVD), metal-organic chemical vapor deposition (MOCVD), molecular beam epitaxy (MBE), and atomic layer deposition, but the present invention is not limited thereto.

Figure 9:
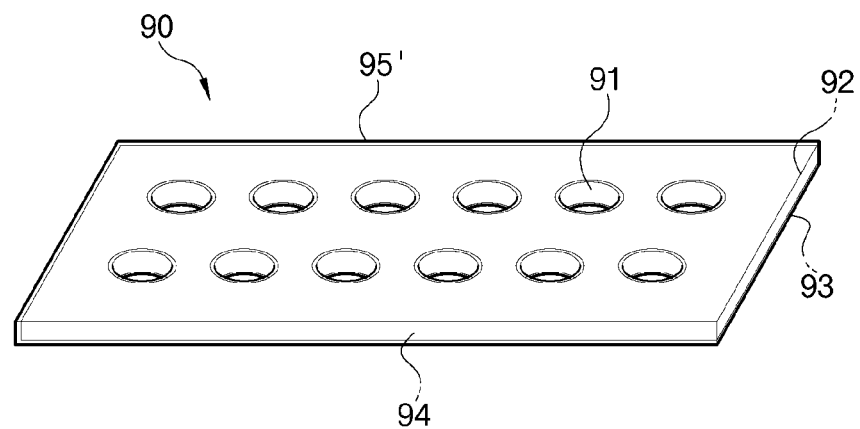
FIG. 9 is a perspective view of a colorless transparent semiconductor substrate according to another embodiment.

FIG. 9 is a perspective view of a colorless transparent semiconductor substrate according to another embodiment.

Referring to FIG. 9, a colorless transparent semiconductor substrate 90 includes a first surface 92 and a second surface 93, and has a thickness 94 between the first surface and the second surface, and the silicon substrate 90 includes a plurality of through-holes 91 penetrating the first surface 92, the second surface 93, and the thickness between the first surface and the second surface, and further includes a coating layer 95' covering the first surface, the second surface, and an inner surface of the plurality of through-holes 91 penetrating the thickness 94 between the first surface and the second surface.

The coating layer 95' may include a passivation layer. The passivation layer may passivate defects present on a surface of the substrate and reduce reflectance of incident sunlight. When the defects present on the surface of the substrate are passivated, the surface can be stabilized and an implied Voc increases. For example, when the passivation layer is not applied to the surface of the same semiconductor substrate, the implied Voc is 517 mV, but when the passivation layer was applied, the implied Voc increases to 536 mV.

In addition, when such a substrate is applied to a solar cell, since solar reflectance decreases and the amount of light reaching a P-N junction increases, the short-circuit current of the solar cell increases, and as a result, the photoelectric conversion efficiency of the solar cell may be improved.

The passivation layer is formed by a method such as sputtering, e-beam evaporation, chemical vapor deposition (CVD), physical vapor deposition (PVD), metal-organic chemical vapor deposition (MOCVD), molecular beam epitaxy (MBE), and atomic layer deposition, but the present invention is not limited thereto.

Figure 10:
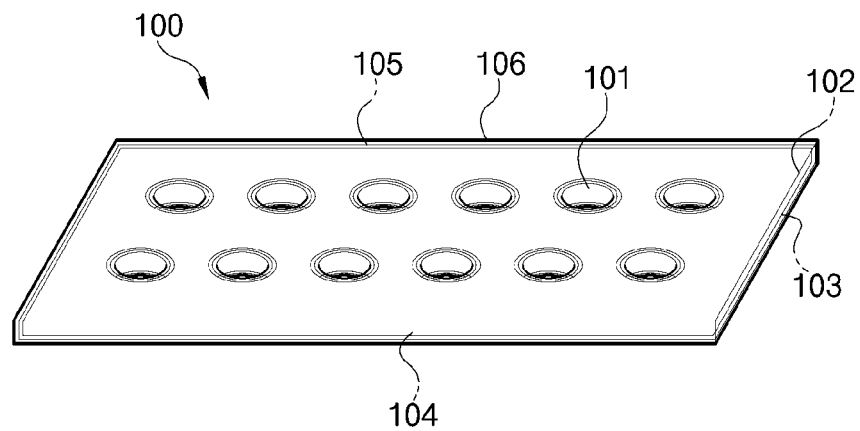
FIG. 10 is a perspective view of the colorless transparent semiconductor substrate according to another embodiment.

FIG. 10 is a perspective view of a colorless transparent semiconductor substrate according to a further embodiment.

Referring to FIG. 10, a colorless transparent semiconductor substrate 100 includes a first surface 102 and a second surface 103, and has a thickness 104 between the first surface and the second surface, and the silicon substrate 100 includes a plurality of through-holes 101 penetrating the first surface 102, the second surface 103, and the thickness between the first surface and the second surface, and further includes a first coating layer 105 and a second coating layer 106 covering the first surface, the second surface, and an inner surface of the plurality of through-holes 101 penetrating the thickness 104 between the first surface and the second surface. At this time, the first coating layer and the second coating layer may be disposed to contact each other, and the first coating layer may be disposed to directly contact the first surface, the second surface, and the inner surface of the through-hole. The second coating layer may be disposed on the first coating layer.

The first coating layer 105 may be the passivation layer, and the second coating layer 106 may be the anti-reflection layer or the light-reflecting layer. Information on the passivation layer, the anti-reflection layer, and the light-reflecting layer refers to the above.

According to an embodiment, the above-described colorless transparent semiconductor substrate may be used in various electronic devices using a semiconductor substrate, for example, a memory semiconductor, a non-memory semiconductor, a device including an electronic circuit, the solar cell, an organic light emitting device, a light emitting device (LED), a lighting device, and the like.

Figure 11:
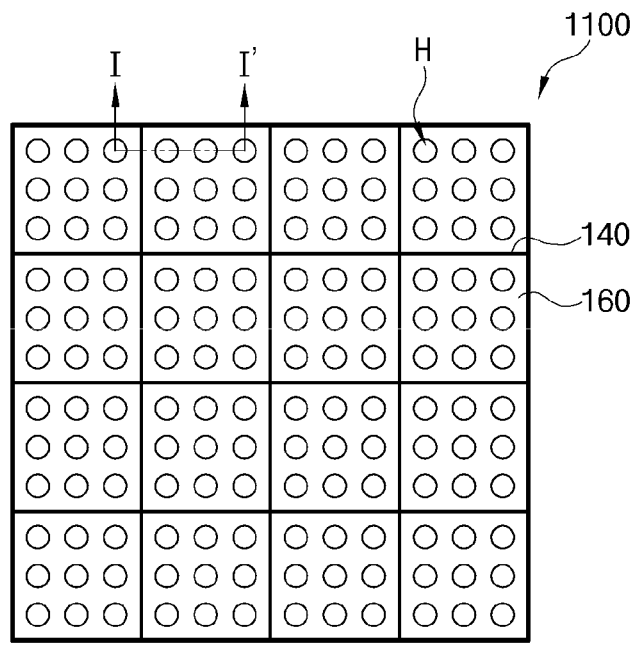
FIG. 11 is a plan views schematically illustrating a solar cell manufactured by employing the colorless transparent semiconductor substrate according to an embodiment.
Figure 12:
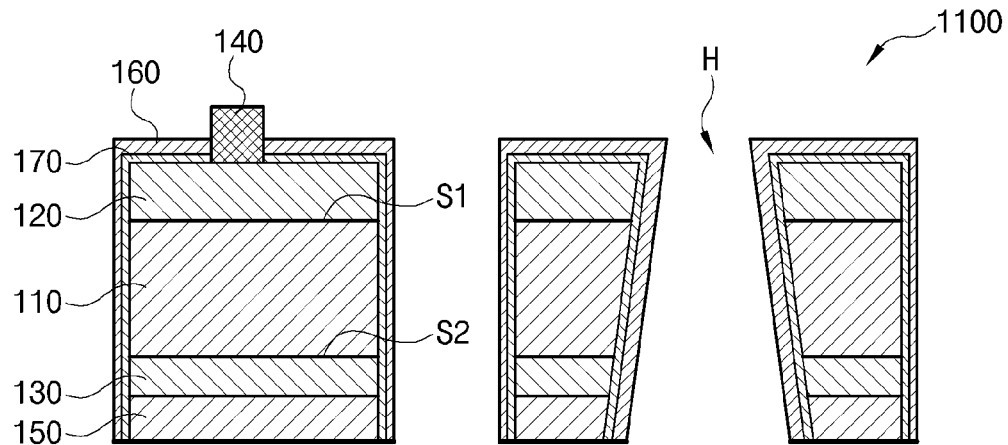
FIG. 12 is a cross-sectional view schematically illustrating a cross section I-I' of FIG. 11.

FIG. 11 is a perspective view of the solar cell manufactured by using the colorless transparent semiconductor substrate according to an embodiment.

A solar cell 1100 according to an embodiment of the present invention may include a colorless transparent semiconductor substrate 110, a first layer 120 located on a first surface S1 of the semiconductor substrate 110, a second layer 130 located on a second surface S2 of the semiconductor substrate 110 which is an opposite surface to the first surface S1, a first electrode 140 located on the first layer 120 and connected to the first layer 120, and a second electrode 150 located on the second layer 130 and connected to the second layer 130. In addition, the solar cell 100 may further include an antireflection film 160 and a protective film 170 located the first layer 120.

In the description for the colorless transparent semiconductor substrate 110, overlapping contents will be omitted, and contents not described above will be additionally described below.

In an embodiment, the colorless transparent semiconductor substrate may be an N-type or P-type crystalline silicon semiconductor substrate. For example, a crystalline silicon semiconductor substrate may be doped with group V elements P, As, Sb, or the like as N-type impurities. For example, the crystalline silicon semiconductor substrate may be implemented as a P-type by doping with Group III elements B, Ga, In, or the like as P-type impurities.

Meanwhile, although not illustrated in the drawings, a light-receiving surface of the semiconductor substrate may include various types of concave-convex structures (not illustrated) such as pyramids, squares, and triangles. The concave-convex structures (not illustrated) reduce the reflectance of light incident on the semiconductor substrate, so that the photoelectric change efficiency of the solar cell 1100 may be improved.

The first layer 120 may form a P-N junction with the semiconductor substrate 110. For example, the first layer 120 may be an emitter layer formed by doping the semiconductor substrate 110 with impurities having a second conductivity type. Accordingly, the first surface S1 of the semiconductor substrate 110 is not a clearly divided region and may be understood as a region in which the P-N junction is formed.

For example, when the semiconductor substrate 110 is doped with an N-type impurity, the first layer 120 may be doped with a P-type impurity. Conversely, when the semiconductor substrate 110 is doped with the P-type impurity, the first layer 120 may be doped with the N-type impurity. As described above, when the first layer 120 which is the emitter layer and the crystalline silicon semiconductor substrate 110 have opposite conductivity types, the PN junction is formed at an interface between the semiconductor substrate 110 and the first layer 120, and when light is irradiated to the P-N junction, photovoltaic power may be generated due to photoelectric effect.

For example, the second layer 130 may be a rear electric field layer BSF formed by doping impurities having a first conductivity type on the semiconductor substrate 110. Accordingly, the second surface S2 of the semiconductor substrate 110 is not a clearly divided region, and may be understood as a region partitioning the rear electric field layer BSF in the semiconductor substrate 110.

The second layer 130 which is the rear electric field layer BSF can prevent carriers from moving to the rear surface of the semiconductor substrate 110 and being recombined. Accordingly, it is possible to increase the efficiency of the solar cell 1100 by increasing an open-circuit voltage Voc of the solar cell 1100.

The first electrode 140 and the second electrode 150 collect the carriers generated by irradiation of light and become a moving path through which the carriers move to an external electronic device electrically connected to the solar cell 1100.

The first electrode 140 may be positioned on a light-receiving surface of the solar cell 1100, and, at this time, the first electrode unit 140 may have a microgrid pattern. As an example, a line width of the microgrid pattern may be 5 μm to 1 mm, so that an opening ratio of the first electrode unit 140 may be formed to be equal to or greater than 90%. Accordingly, it is possible to minimize a phenomenon that light incident by the first electrode 140 is blocked. On the other hand, the second electrode 150 may have the same shape as the second surface S2 of the crystalline silicon semiconductor substrate 110 and may be formed on the entire bottom surface of the solar cell 1100.

Meanwhile, the semiconductor substrate 110 may include a plurality of through-holes H passing through the semiconductor substrate 110 from the first surface S1 to the second surface S2. The plurality of through-holes H may extend to penetrate at least the first layer 120, the second layer 130, and the second electrode 150. At this time, the first electrode 140 having the microgrid pattern may be positioned between the plurality of through-holes H. Accordingly, some of light incident on the solar cell 1100 may pass through the plurality of through-holes H, so that the solar cell 1100 may have light transmission properties.

The description for the through-hole H refers to the description of the colorless transparent semiconductor substrate described above.

In addition, the solar cell 1100 according to an embodiment of the present invention may adjust the transparency, that is, the brightness, of the solar cell 1100 by adjusting the Filling Fraction. The Filling Fraction refers to a value obtained by subtracting the total area of the plurality of through-holes H from the area of the semiconductor substrate 110 by dividing the area of the crystalline silicon semiconductor substrate 110. In the solar cell 1100 according to an embodiment of the present invention, the transmittance decreases as the Filling Fraction increases. At this time, since the solar cell 1100 has a transparent property that a specific color is not expressed, the solar cell 1100 may have a gradually dark property as the Filling Fraction increases. Accordingly, the solar cell 1100 according to an embodiment of the present invention may adjust the transmittance, that is, the transparency, according to various environments to which the solar cell 1100 is applied. For example, in a case where the solar cell 1100 according to an embodiment of the present invention is applied to a sunroof of an automobile and a case where it is applied to a window of a building, the transparency of the solar cell 1100 may be set differently.

Table 1 below shows the photoelectric conversion efficiency of the solar cell 1100 according to the total area of the plurality of through-holes H, where the total area of the plurality of through-holes H may be expressed as the Filling Fraction.

TABLE 1

| Filling Fraction | 40% | 50% | 60% | 70% | 80% | 95% | 100% |
| --- | --- | --- | --- | --- | --- | --- | --- |
| Voc (mV) | 538 | 538 | 548 | 578 | 588 | 590 | 596 |
| Jsc (mA/cm$^2$) | 15.8 | 19.1 | 23.8 | 26.5 | 29.4 | 35.0 | 36.4 |
| Fill Factor (%) | 59.0 | 57.9 | 60.7 | 66.2 | 66.0 | 68.0 | 75.2 |
| Efficiency (%) | 5.0 | 6.0 | 7.9 | 10.1 | 11.4 | 14.0 | 16.3 |

As can be seen from the Table 1, the efficiency of the solar cell 1100 increases as the Filling Fraction increases. On the other hand, as described above, when the Filling Fraction increases, the transparency of the solar cell 1100 decreases, and thus, the Filling Fraction may decrease in order to increase the transparency of the solar cell 1100. However, when the Filling Fraction is less than 40%, the efficiency of the solar cell 1100 becomes less than 5%, which is not preferable. On the other hand, when the Filling Fraction is equal to or greater than 95%, it becomes difficult for the solar cell 1100 to maintain light transmittance. Therefore, the total area of the plurality of through-holes H may be formed to be greater than 5% to equal to or less than 60% of the area of the semiconductor substrate 110, and preferably equal to or greater than 20% and equal to or less than 50% in consideration of the efficiency and transmittance of the solar cell 1100.

In the above, although it has been described with reference to the embodiments illustrated in the drawings, this is only exemplary, and those of ordinary skill in the art will understand that various modifications and equivalent other embodiments are possible therefrom. Therefore, the true technical protection scope of the present invention should be determined by the technical spirit of the appended claims.

The invention claimed is:

1. A transparent semiconductor substrate comprising:
a semiconductor substrate including a first surface and a second surface opposite to the first surface, wherein the first surface is parallel to the second surface, wherein the semiconductor substrate includes crystalline silicon (c-Si), germanium (Ge), gallium arsenide (GaAs), gallium arsenide Phosphide (GaAsP), amorphous silicon (a-Si), or a combination thereof; and
a plurality of through-holes, each through-hole penetrating the semiconductor substrate,
wherein each through-hole includes an inclined portion having a first and a second inclined portions with respect to the first surface and second surface, the first inclined portion forming a first acute angle $\theta_1$ with respect to the first surface and the second inclined portion forming a second acute angle $\theta_2$ with respect to the first surface, wherein the first acute angle $\theta_1$ is same as the second acute angle $\theta_2$, wherein a diameter of each through-hole increases from the first surface to the second surface, wherein the diameter of each through-hole at the first surface is smaller than the diameter of each through-hole at the second surface, wherein the first surface is positioned to receive incident light,
wherein the inclined portion is formed with a coating layer which is a light-reflecting layer or an anti-reflection layer,
wherein a total area of the plurality of through-holes on the first surface is smaller than a total area of the plurality of through-holes on the second surface, the total area of the plurality of through-holes on the first surface is formed 5% to 95% of a total area of the semiconductor substrate, and the total area of the plurality of through-holes on the second surface is formed 6% to 96% of the total area of the semiconductor substrate,
wherein a distance between adjacent through holes on the first surface is equal to or less than 200 μm,
wherein the diameter of each through-hole on the first surface is defined so that a haze value calculated by Equation 1 below is less than 1%, $$H(\%) = T_d/T_t \times 100 \qquad \text{<Equation 1>}$$

where $T_d$ is diffuse transmittance and $T_t$ is total transmittance.

2. The transparent semiconductor substrate of claim 1, wherein a cross section of each through-hole in a longitudinal direction is a trapezoidal shape.

3. The transparent semiconductor substrate of claim 1, wherein the transparent semiconductor substrate further includes the light-reflecting layer.

4. The transparent semiconductor substrate of claim 1, wherein the transparent semiconductor substrate further includes the light-reflecting layer disposed on the first surface, the inclined portion of each through-hole, and the second surface.

5. The transparent semiconductor substrate of claim 1, wherein the transparent semiconductor substrate further includes the anti-reflection layer.

6. The transparent semiconductor substrate of claim 1, wherein the transparent semiconductor substrate further includes the anti-reflection layer disposed on the first surface, the inclined portion of each through-hole, and the second surface.

7. The transparent semiconductor substrate of claim 1, wherein the transparent semiconductor substrate further includes a passivation layer disposed on the first surface, the second surface, and the inclined portion of each through-hole.

8. The transparent semiconductor substrate of claim 1, wherein the transparent semiconductor substrate further includes a passivation layer disposed to directly contact the first surface, the second surface, and the inclined portion of each through-hole.

9. The transparent semiconductor substrate of claim 7, wherein the passivation layer disposed on the first surface, the second surface, and/or the inclined portion of each through-hole includes oxides, carbides, or nitrides of at least one element selected from metals, transition metals, and metalloids.

10. An electronic apparatus including the transparent semiconductor substrate according to claim 1.

* * * * *